(12) United States Patent
Furuhashi

(10) Patent No.: US 10,770,509 B2
(45) Date of Patent: Sep. 8, 2020

(54) MAGNETIC STORAGE DEVICE RADIATING HEAT FROM SELECTOR

(71) Applicant: TOSHIBA MEMORY CORPORATION, Minato-ku, Tokyo (JP)

(72) Inventor: Hironobu Furuhashi, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 42 days.

(21) Appl. No.: 16/122,239

(22) Filed: Sep. 5, 2018

(65) Prior Publication Data

US 2019/0288032 A1  Sep. 19, 2019

(30) Foreign Application Priority Data

Mar. 16, 2018 (JP) .................. 2018-049840

(51) Int. Cl.
| | | |
|---|---|---|
| *H01L 27/22* | (2006.01) | |
| *H01L 43/02* | (2006.01) | |
| *G11C 11/16* | (2006.01) | |
| *H01L 43/10* | (2006.01) | |

(52) U.S. Cl.
CPC .......... *H01L 27/224* (2013.01); *G11C 11/161* (2013.01); *G11C 11/1675* (2013.01); *H01L 43/02* (2013.01); *H01L 43/10* (2013.01)

(58) Field of Classification Search
CPC ..... H01L 27/224; H01L 27/226; H01L 43/10; H01L 43/02; G11C 11/161; G11C 11/1675
See application file for complete search history.

(56) References Cited

U.S. PATENT DOCUMENTS

| | | | | |
|---|---|---|---|---|
| 8,907,390 B2* | 12/2014 | Reid | ............... | B82Y 25/00 |
| | | | | 257/295 |
| 2013/0175647 A1* | 7/2013 | Zheng | ............... | B82Y 25/00 |
| | | | | 257/421 |
| 2014/0063924 A1 | 3/2014 | Nakai et al. | | |
| 2015/0372055 A1 | 12/2015 | Chen | | |
| 2016/0020250 A1 | 1/2016 | Li et al. | | |
| 2017/0117027 A1 | 4/2017 | Braganca et al. | | |
| 2017/0170237 A1* | 6/2017 | Jung | ............... | H01L 45/1233 |

FOREIGN PATENT DOCUMENTS

JP          2014049497 A      3/2014

* cited by examiner

*Primary Examiner* — David Lam
(74) *Attorney, Agent, or Firm* — Holtz, Holtz & Volek PC

(57) ABSTRACT

According to one embodiment, a magnetic device includes a first memory cell including a magnetoresistive effect element, a selector, and a first barrier material disposed between the selector and the magnetoresistive effect element, wherein the first barrier material has a thermal conductivity of 5 W/mK or lower.

17 Claims, 9 Drawing Sheets

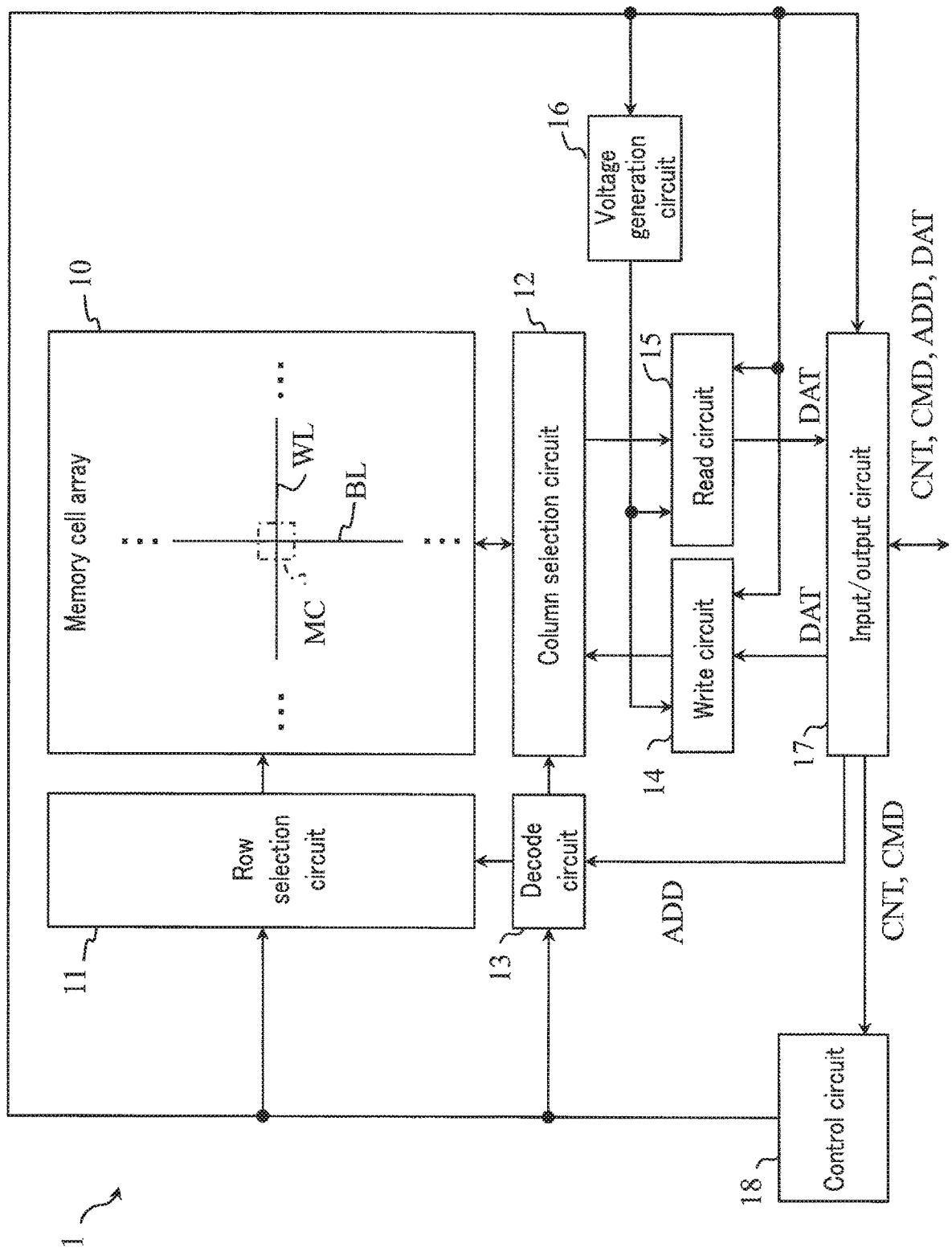
F I G. 1

F.I.G. 3

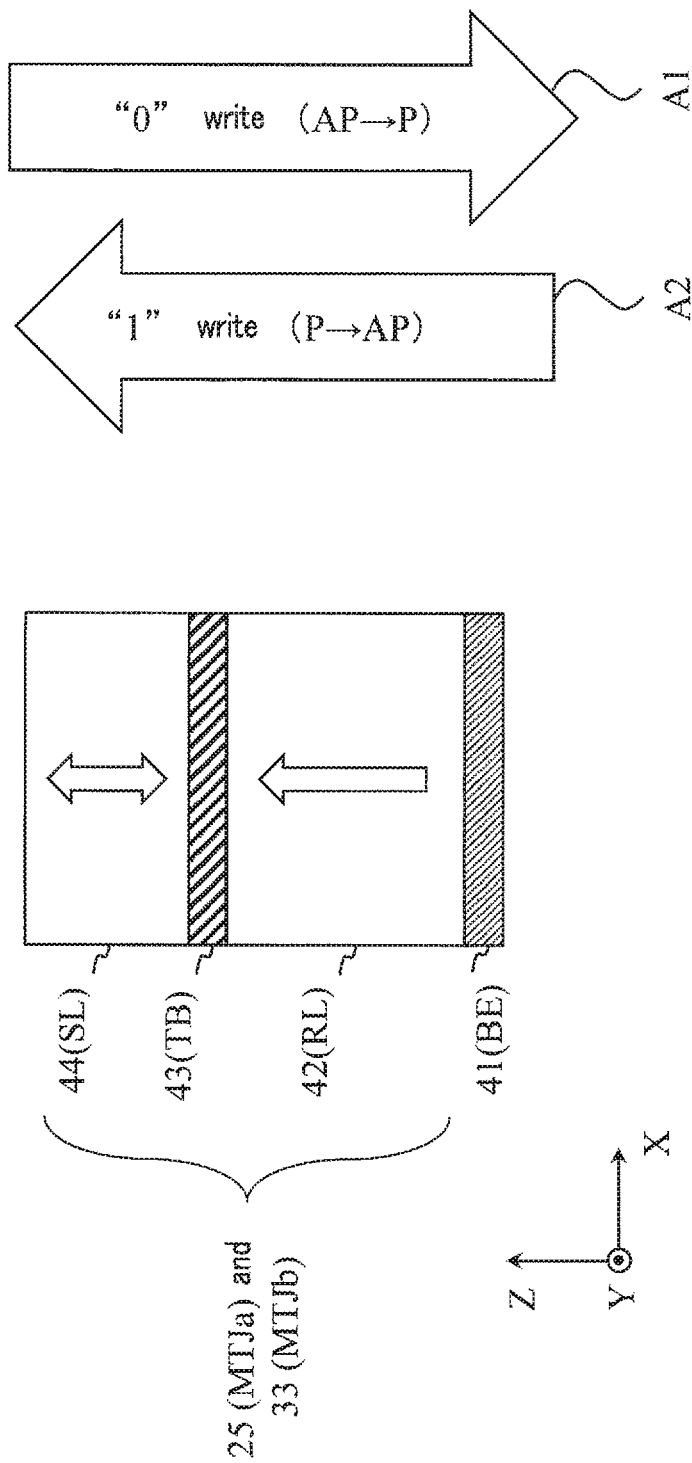
F I G. 4

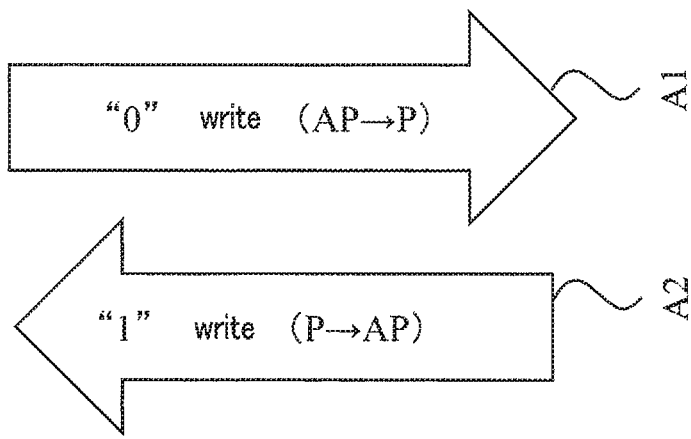
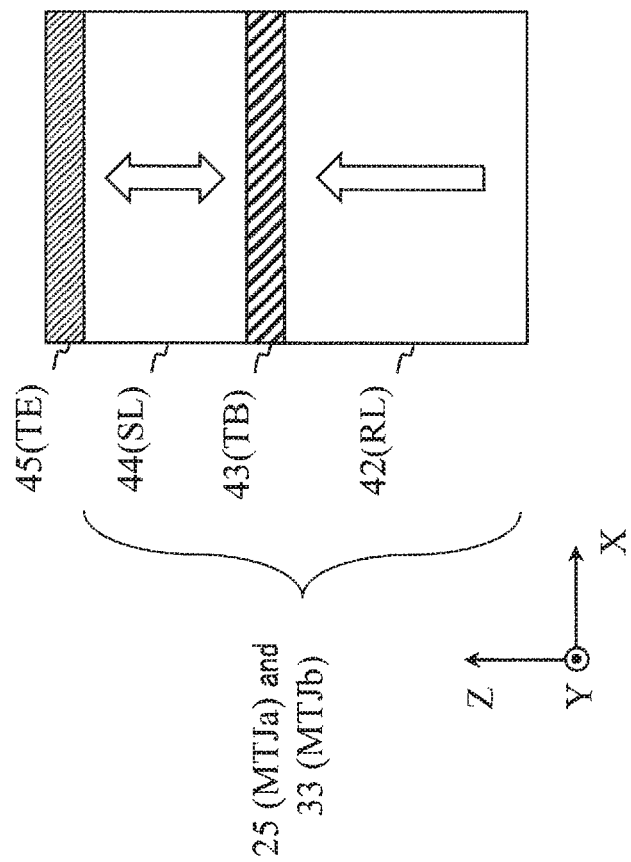
F I G. 8

MAGNETIC STORAGE DEVICE RADIATING HEAT FROM SELECTOR

CROSS-REFERENCE TO RELATED APPLICATIONS

This application is based upon and claims the benefit of priority from Japanese Patent Application No. 2018-049840, filed Mar. 16, 2018, the entire contents of which are incorporated herein by reference.

FIELD

Embodiments described herein relate generally to a magnetic storage device.

BACKGROUND

There is known a magnetic storage device (MRAM: Magnetoresistive Random Access Memory) using a magnetoresistive effect element as a storage element.

BRIEF DESCRIPTION OF THE DRAWINGS

FIG. 1 is a block diagram for describing the configuration of a magnetic storage device according to a first embodiment.

FIG. 4 is a cross-sectional view for describing the configuration of a magnetoresistive effect element of the magnetic storage device according to the first embodiment.

FIG. 8 is a cross-sectional view for describing the configuration of a magnetoresistive effect element of the magnetic storage device according to the modification.

DETAILED DESCRIPTION

Figure 2:
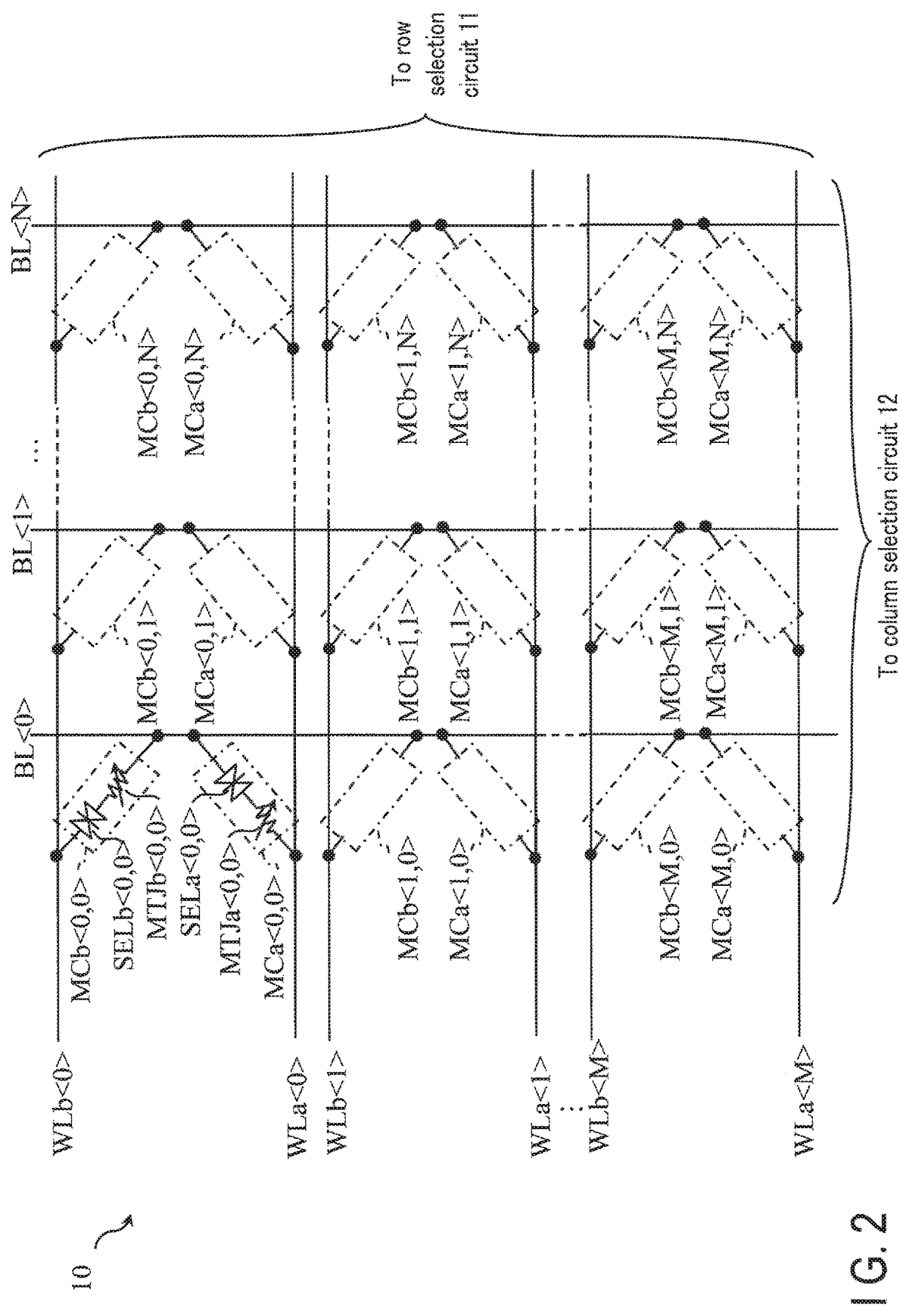
FIG. 2 is a circuit diagram for describing the configuration of a memory cell array of the magnetic storage device according to the first embodiment.

In general, according to one embodiment, a magnetic storage device includes a first memory cell including a magnetoresistive effect element, a selector, and a first barrier material disposed between the selector and the magnetoresistive effect element, wherein the first barrier material has a thermal conductivity of 5 W/mK or lower.

Embodiments will be described below with reference to the accompanying drawings. Note that in the following description, common reference numerals denote components having the same functions and arrangements. To discriminate between a plurality of components having a common reference numeral, subscripts are added to the common reference numeral. Note that if it is not necessary to specifically discriminate between the plurality of components, the common reference numeral without any subscripts denotes the plurality of components.

1. First Embodiment

A magnetic storage device according to a first embodiment will be described. The magnetic storage device according to the first embodiment is, for example, a magnetic storage device by a perpendicular magnetization method, which uses a magnetoresistive effect (MTJ: Magnetic Tunnel Junction) element as a storage element.

1.1 Configuration

First, the configuration of the magnetic storage device according to the first embodiment will be described.

1.1.1 Configuration of Magnetic Storage Device

FIG. 1 is a block diagram showing the configuration of the magnetic storage device according to the first embodiment. As shown in FIG. 1, a magnetic storage device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array includes a plurality of memory cells MC each of which is associated with a row and a column. Specifically, memory cells MC on an identical row are coupled to an identical word line WL, and memory cells MC on an identical column are to an identical bit line (BL).

The row selection circuit 11 is coupled to the memory cell array 10 via word lines WL. A decode result (row address) of an address ADD from the decode circuit 13 is supplied to the row selection circuit 11. The row selection circuit 11 sets a word line WL corresponding to a row, based on the decode result of the address ADD, to a selected state. Hereinafter, a word line WL set to the selected state is referred to as a selected word line WL. Word lines WL other than the selected word line WL are referred to as unselected word lines WL.

The column selection circuit 12 is coupled to the memory cell array 10 via bit lines BL. A decode result (column address) of an address ADD from the decode circuit 13 is supplied to the column selection circuit 12. The column selection circuit 12 sets a column based on the decode result of the address ADD to a selected state. Hereinafter, a bit line BL set to the selected state is referred to as a selected bit line BL. Bit lines BL other than the selected bit line BL are referred to as unselected bit lines BL.

The decode circuit 13 decodes an address ADD from the input/output circuit 17. The decode circuit 13 supplies a decode result of the addresses ADD to the row selection circuit 11 and the column selection circuit 12. The addresses ADD include a column address selected and a row address which are to be selected.

The write circuit 14 executes write of data to the memory cells MC. The write circuit 14 includes, for example, a write driver (not shown).

The read circuit 15 executes read of data from a memory cells MC. The read circuit 15 includes, for example, a sense amplifier (not shown).

The voltage generation circuit 16 generates voltages for various operations of the memory cell array 10 by using a power supply voltage which is disposed from the outside (not shown) of the magnetic storage device 1. For example, the voltage generation circuit 16 generates various voltages necessary at a time of a write operation and outputs the voltages to the write circuit 14. Also, for example, the voltage generation circuit 16 generates various voltages which are necessary at a time of a read operation and outputs the voltages to the read circuit 15.

The input/output circuit 17 transfers the addresses ADD from the outside of the magnetic storage device 1 to the decode circuit 13. The input/output circuit 17 transfers a command CMD from the outside of the magnetic storage device 1 to the control circuit 18. The input/output circuit 17 transmits and receives various control signals CNT between the external of the magnetic storage device 1 and the control circuit 18. The input/output circuit 17 transfers data DAT from the outside of the magnetic storage device 1 to the write circuit 14 and outputs the data DAT, which is transferred from the read circuit 15, to the outside of the magnetic storage device 1.

The control circuit 18 controls, based on the control signals CNT and commands CMD, the operations of the row-selection circuit 11, column selection circuit 12, decode circuit 13, write circuit 14, read circuit 15, voltage generation circuit 16, and input/output circuit 17 in the magnetic storage device 1.

1.1.2 Configuration of Memory Cell Array

Next, the configuration of the memory cell array of the magnetic storage device according to the first embodiment will be described with reference to FIG. 2. FIG. 2 is a circuit diagram showing the configuration of the memory cell array of the magnetic storage device according to the first embodiment. In FIG. 2, the word lines WL are categorized into two types (WLa and WLb) and shown.

As shown in FIG. 2, memory cells MC (MCa and MCb) are arranged in a matrix form in the memory cell array 10, and each memory cell MC is associated with a pair of one of a plurality of bit lines BL (BL<0>, BL<1>, ... BL<N>) and one of a plurality of word lines WLa (WLa<0>, WLa<1>, ... WLa<M>) and word lines WLb (WLb<0>, WLb<1>, ... WLb<M>) (M and N are arbitrary integers). Namely, a memory cell MCa<i, j> ($0 \leq i \leq M$, $0 \leq j \leq N$) is coupled between a word line WLa<i> and a bit line BL<j>, and a memory cell MCb<i, j> are coupled between a word line WLb<i> and a bit line BL<j>.

Note that subscripts "a" and "b" respectively identify, for example, those disposed below or above bit lines (BL), for descriptive purpose. Examples of a three-dimensional configuration of the memory cell array 10 will be described later.

The memory cell MCa<i, j> includes a selector SELa<i,j> and a magnetoresistive effect element MTJa<i,j> that are coupled in series. The memory cell MCb<i,j> includes a selector SELb<i,j> and a magnetoresistive effect element MTJb<i,j> that are coupled in series.

A selector SEL has a function as a switch to control the supply of an electric current to a corresponding magnetoresistive effect element MTJ at the time of writing data in or reading data from a corresponding magnetoresistive effect element MTJ. Specifically, if, for example, a voltage applied to a certain memory cell MC falls below a threshold voltage Vth, the selector SEL in the memory cell MC cuts off, as an insulator having a large resistance value, an electric current (is turned to the OFF-state), and if the voltage applied exceeds the threshold voltage Vth, the selector SEL in the memory cell MC feeds, as a conductor having a small resistance value, an electric current (is turned to the ON-state). That is, the selector SEL has a function capable of switching between feeding an electric current and cutting off an electric current in accordance with the magnitude of the voltage applied to the memory cell MC, regardless of the flowing direction of the electric current.

The magnetoresistive effect element MTJ can switch the resistance value between a low resistance state and a high resistance state by the current whose supply is controlled by the selector SEL. The magnetoresistive effect element MTJ functions as a storage element in which data can be written depending on a change in the resistance state, the written data is retained in a nonvolatile state, and from which the written data can be read out.

Figure 3:
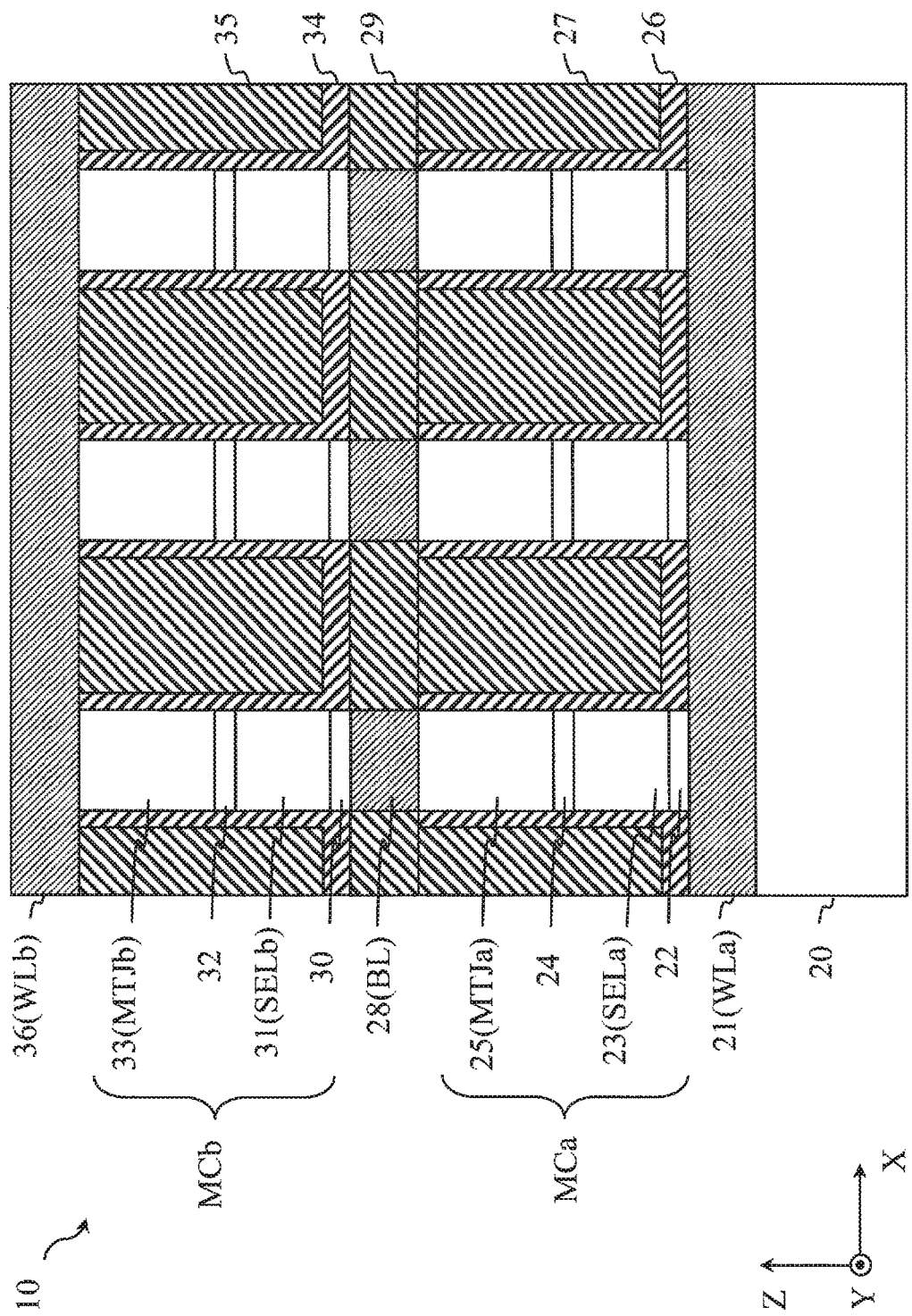
FIG. 3 is a cross-sectional view for describing the configuration of the memory cell array of the magnetic storage device according to the first embodiment.

Next, the cross-sectional configuration of the memory cell array 10 will be described with reference to FIG. 3. FIG. 3 shows an example of a cross-sectional configuration along word lines for a memory cell array of the magnetic storage device according to the first embodiment.

As shown in FIG. 3, the magnetic storage device 1 is disposed on a semiconductor substrate 20. In the following descriptions, a surface parallel with a surface of the semiconductor substrate 20 is denoted by an XY plane, and a direction perpendicular to the XY plane is denoted by a Z-direction. A direction along word lines WL is denoted by an X-direction, and a direction along bit lines BL is denoted by a Y-direction. The X-direction and the Y-direction are, for example, orthogonal to one another in the XY plane.

On the upper portion of the semiconductor substrate 20, for example, a plurality of conductors 21 functioning as word lines WLa are disposed. The plurality of conductors 21 are arranged, for example, along the Y-direction, and each of the conductors 21 extends along the X-direction. On regions of the semiconductor substrate 20 where the conductors 21 are not disposed, for example, an insulator (not shown) is disposed up to the height of the conductors 21.

On the upper portion of the conductors 21, a barrier material (heat radiation material) 22 is disposed in a plurality of locations. The heat radiation material 22 disposed so as to be arranged in the plurality of locations along the X-direction is commonly coupled to one conductor 21. The heat radiation material 22 has a function to radiate heat generated by a selector SELa toward the conductors 21 side, while having a function as a conductor to become an electric current path of memory cells MCa. The thermal conductivity of the heat radiation material 22 is desirably higher than the thermal conductivity of the heat insulation material 24 which will be described later, and is more desirably 10 W/mK or higher. The heat radiation material 22 includes, for example, tungsten (W), tungsten nitride (WN) or titanium nitride (TiN).

On respective upper portions of the heat radiation material 22 disposed in the plurality of locations, an element 23 functioning as a selector SELa is disposed. The element 23 may be a two-terminal (binary) switching element, for example. When a voltage that is applied between a pair of terminals is less than a threshold voltage, the switch element can remain in a "high resistive" state, e.g., an electrically non-conductive state. When the voltage applied between the two the pair of terminals is equal to or greater than the threshold voltage, the switching element can turn into a "low resistive" state, e.g., an electrically conductive state. The switching element may have this function in both polarity of the voltage. The switching element includes at least one chalcogen element selected from the group consisting of tellurium (Te), selenium (Se), and sulfur (S), or may include chalcogenide, which is a compound including the chalcogen element. In addition to the chalcogen elements or the chalcogenide, the switching element may include at least one selected from the group consisting of boron (B), aluminum (Al), gallium (Ga), indium (In), carbon (C), silicon (Si), germanium (Ge), tin (Sn), arsenic (As), phosphor (P), and antimony (Sb).

Note that expressions "equal to or higher than" and "equal to or lower than" described above mean that the subject includes an up-or-down fluctuation range of numerical values caused by, for example, a measurement, etc. That is, the expressions also include a fluctuation range enabling obtainment of the effects of the present embodiment and the embodiments. The expression "equal to or higher than" and "equal to or lower than" described below also have the same meaning.

On respective upper portions of the element 23 disposed in the plurality of locations, a barrier material (heat insulation material) 24 is disposed. The heat insulation material 24 has a function to prevent heat generated by the selector SELa from being transmitted to the upper layers (toward the magnetoresistive effect elements MTJ side) while having a function as a conductor to become an electric current path of the memory cell MCa. The thermal conductivity of the heat insulation material 24 is desirably 5 W/mK or lower, and is more desirably 2 W/mK or lower. On the other hand, as described above, the heat insulation material 24 also serves as an electric current path, and thus, it is not preferable to use a material having a very low thermal conductivity and also having a low electrical conductivity such as that of insulators. For this reason, the thermal conductivity of the heat insulation material 24 is desirably 1 W/mK or higher. The heat insulation material 24 includes, for example, carbon (C), carbon nitride (CN), or carbon boride (CB).

On respective upper portions of the heat insulation material 24 disposed in the plurality of locations, an element 25 functioning as a magnetoresistive effect element MTJa is disposed. Details of the element 25 will be described later.

On surfaces of the upper portions of the conductors 21 where the heat radiation material 22 is not disposed, and on side surfaces of the heat radiation material 22, the element 23, the heat insulation material 24, and the element 25 stacked in this order along the Z-direction, a heat radiation material 26, for example, is disposed. The heat radiation material 26 has a function to radiate heat generated by the selector SELa to an insulator 27 which is described later, while insulating the memory cell MCa from the other memory cells MCa (and memory cells MCb). The thermal conductivity of the heat radiation material 26 is desirably higher than the thermal conductivity of the heat insulation material 24, and is more desirably higher than 5 W/mK. The heat radiation material 26 includes, for example, silicon nitride (SiN).

On the heat radiation material 26, for example, an insulator 27 is disposed up to the height of the element 25. The insulator 27 includes, for example, silicon dioxide ($SiO_2$).

On respective upper portions of the element 25 disposed in a plurality of locations, a conductor 28 functioning as a bit line BL is disposed. The conductor 28 is disposed so as to be arranged in the plurality of location, for example, along the X-direction, and each of the conductors extends along the Y-direction. The plurality of conductors 28 arranged along the X-direction are respectively coupled in common to a plurality of elements 25 (not shown) arranged along the Y-direction. Of the top surfaces of the heat radiation material 26 and the insulator 27, on regions where the conductor 28 is not disposed, for example, an insulator 29 is disposed up to the height of the conductors 28.

On respective upper portions of the plurality of conductors 28, a heat radiation material 30 is disposed in a plurality of locations. The heat radiation material 30 disposed in the plurality of locations so as to be arranged along the Y-direction is commonly coupled to one conductor 28. The heat radiation material 30 has a function to radiate heat generated by a selector SELb toward the conductors 28 side, while having a function as a conductor to become an electric current path of a memory cell MCb. The thermal conductivity of the heat radiation material 30 is desirably higher than the thermal conductivity of a heat insulation material 32 which will be described later, and is more desirably 10 W/mK or higher. The heat radiation material 30 includes, for example, tungsten (W), tungsten nitride (WN) or titanium nitride (TiN), like the heat radiation material 22.

On respective upper portions of the heat radiation material 30 disposed in the plurality of locations, an element 31 functioning as a selector SELb is disposed. The element 31 includes, for example, elements including chalcogenide, like the element 23 described above.

On respective upper portions of a plurality of elements 31, a heat insulation material 32 is disposed. The heat insulation material 32 has a function to prevent heat generated by the selector SELb from being transmitted to the upper layers (on the magnetoresistive effect elements MTJ side) while having a function as a conductor to become an electric current path of the memory cell MCb. The thermal conductivity of the heat insulation material 32 is desirably 5 W/mK or lower, and is more desirably 2 W/mK or lower. Also, the thermal conductivity of the heat insulation material 32 is desirably 1 W/mK or higher. The heat insulation material 32 includes, for example, carbon (C), carbon nitride (CN), or carbon boride (CB), like the heat insulation material 24.

On respective upper portions of the heat insulation material 32 disposed in a plurality of locations, an element 33 functioning as a magnetoresistive effect element MTJb is disposed. Details of the element 33 will be described later.

On surfaces of the upper portions of the conductors 28 where the heat radiation material 30 is not disposed, on the upper portions of the insulators 29, and on side surfaces of the heat radiation material 30, the elements 31, the heat insulation material 32, and the element 33 stacked in this order along the Z-direction, a heat radiation material 34, for example, is disposed. The heat radiation material 34 has a function to radiate heat generated by the selector SELb to an insulator 35 which will be described later, while insulating the memory cell MCb from the other memory cells MCb (and memory cells MCa). The thermal conductivity of the heat radiation material 34 is desirably higher than the thermal conductivity of the heat insulation material 32, and is more desirably higher than 5 W/mK. The heat radiation material 34 includes, for example, silicon nitride (SiN), like the heat radiation material 26.

On the heat radiation material 34, an insulator 35 is disposed up to the height of the element 33. The insulator 35 includes, for example, silicon dioxide ($SiO_2$), like the insulator 27.

On respective upper portions of a plurality of elements 33, a conductor 36 functioning as a word line WLb is disposed. A plurality of conductors 36 are arranged, for example, along the Y-direction, and each of the conductors extends along the X-direction. The plurality of conductors 36 arranged along the Y-direction are coupled in common to the plurality of elements 33 arranged along the X-direction. On regions of the top surfaces of the insulators 34 and 35 where the conductor 36 is not disposed, for example, an insulator (not shown) is disposed up to the height of the conductor 36.

By being configured as described above, the memory cell array 10 has a structure (a layers-stacked cross-point structure), in which cross-point structures each capable of selecting one memory cell MC by a pair of one bit line BL and one word line WL, are stacked in the Z-direction.

1.1.3 Configuration of Magnetoresistive Effect Element

Next, the configuration of a magnetoresistive effect element of the magnetic storage device according to the first embodiment will be described with reference to FIG. 4. FIG. 4 is an example of a cross-sectional view of the magnetoresistive effect element of the magnetic storage device according to the first embodiment being cut along the XZ plane.

As shown in FIG. 4, the elements 25 and 33 each include a ferromagnetic material 42 functioning as a reference layer (RL), a nonmagnetic material 43 functioning as a tunnel barrier layer (TB), and a ferromagnetic material 44 functioning as a storage layer (SL). The ferromagnetic material 42, the nonmagnetic material 43, and the ferromagnetic material 44 constitute a magnetic tunnel junction. On a bottom surface of the ferromagnetic material 42, a nonmagnetic material 41 functioning as a bottom electrode (BE) is disposed.

In the element 25, a plurality of materials are stacked, for example, the nonmagnetic material 41, the ferromagnetic material 42, the nonmagnetic material 43, and the ferromagnetic material 44 are stacked in this order from the word lines WLa side toward the bit lines BL side (in the Z-axis direction). In the element 33, a plurality of materials are stacked, for example, the nonmagnetic material 41, the ferromagnetic material 42, the nonmagnetic material 43, and the ferromagnetic material 44 are stacked in this order from the bit lines BL side toward the word lines WLb side (in the Z-axis direction). The elements 25 and 33 function as a perpendicular magnetization type MTJ element where the magnetization directions of the ferromagnetic materials 42 and 44 are perpendicular to the film plane.

The nonmagnetic material 41 has nonmagnetism and includes, for example, tantalum (Ta), tungsten (W), titanium nitride (TiN), and tantalum nitride (TaN). The nonmagnetic material 41 functions as a conductor (electrode) electrically coupling the magnetoresistive effect elements MTJ and the selector SEL. With this configuration, the nonmagnetic material 41 can have a thermal conductivity nearly equal to those of metals (e.g., 10 W/mK or higher, more preferably, 20 W/mK or higher).

The ferromagnetic material 42 has ferromagnetism and has an axis of easy magnetization in a direction perpendicular to the film plane. The ferromagnetic material 42 has a magnetization direction toward either the bit lines BL side or the word lines WL side. The ferromagnetic material 42 includes, for example, cobalt platinum (CoPt), cobalt nickel (CoNi), or cobalt palladium (CoPd). The magnetization direction of the ferromagnetic material 42 is fixed, and in the example shown in FIG. 4, the magnetization direction of the ferromagnetic material 42 is directed toward the ferromagnetic material 44. Note that the expression, "the magnetization direction is fixed" means that the magnetization direction does not changed by an amount of electric current (spin torque) by which the magnetization direction of the ferromagnetic material 44 may be reversed.

The nonmagnetic material 43 is a nonmagnetic insulation film, and includes, for example, magnesium oxide (MgO).

The ferromagnetic material 44 has ferromagnetism and has the axis of easy magnetization in the direction perpendicular to the film plane. The ferromagnetic material 44 has a magnetization direction toward either the bit lines BL side or the word lines WL side. The ferromagnetic material 44 includes, for example, cobalt-iron-boron (CoFeB) or iron boride (FeB).

In the first embodiment, a spin injection writing method is adopted, which includes directly feeding a write current to such magnetoresistive effect elements MTJ to inject a spin torque into storage layers SL by the write current and to control the magnetization direction of the storage layers SL. The magnetoresistive effect elements MTJ can take either a low-resistance state or a high-resistance state depending on whether the relative relationship of the magnetization direction of the storage layers SL and the magnetization direction of the reference layers RL is parallel or antiparallel.

When a write current in a certain amount is made to flow through the magnetoresistive effect elements MTJ in the direction of an arrow A1 in FIG. 4, i.e., in a direction facing from the storage layer SL to the reference layer RL, the relative relationship of the magnetization direction between the storage layer SL and the reference layer RL becomes parallel. In the case of this parallel state, the resistance value of the magnetoresistive effect elements MTJ decreases, and the magnetoresistive effect elements MTJ are set to a low-resistance state. This low-resistive state is referred to as "parallel (P) state" and is defined, for example, as a state of data "0".

When a write current in an amount greater than the write current used to write data "0" is made to flow through the magnetoresistive effect elements MTJ in the direction of the arrow A2 in FIG. 4, i.e., in a direction facing from the reference layer RL to the storage layer SL, the relative relationship of the magnetization direction between the storage layer SL and the reference layer RL becomes antiparallel. In the case of this antiparallel state, the resistance value of the magnetoresistive effect elements MTJ increases, and the magnetoresistive effect elements MTJ are set to a high-resistance state. This high-resistance state is referred to as "Anti-Parallel (AP) state" and is defined, for example, as a state of data "1". These resistance states of the magnetoresistive effect elements MTJ are semi-permanently retained; however, the resistance state may be reversed by an external factor such as a temperature, etc. Herein, the difficulty in reversing the resistance state against the external factor is referred to as a "retention property".

Note that the following descriptions are provided in accordance with the above-described method of defining data; however, the method of defining data "1" and "0" is not limited to the above example. For example, a P state may be defined as data "1", and an AP state may be defined as data "0".

1.2 Selection Operation of Memory Cell

Next, selection operations of a memory cell in the magnetic storage device according to the first embodiment will be described. In the following explanations, a memory cell MC to be written or to be read out, i.e., a memory cell MC associated with a pair of a selected word line WL and a selected bit line BL, is referred to as a selected memory cell MC (or a memory cell MC in a selected state).

Figure 5:
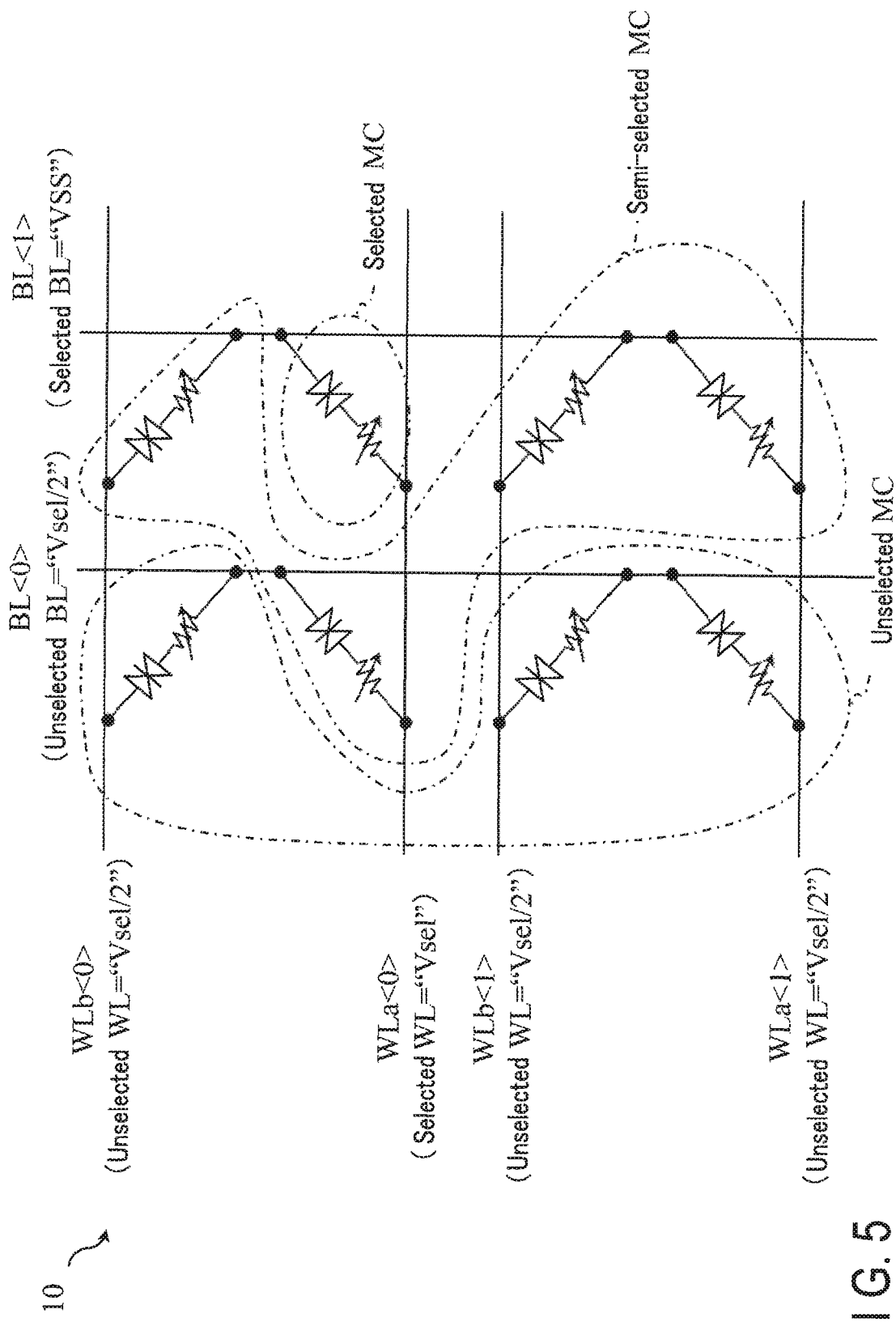
FIG. 5 is a schematic diagram for describing a selection operation of a memory cell in the magnetic storage device according to the first embodiment.

FIG. 5 is a schematic diagram for describing the outline of the selection operations of a memory cell of the magnetic storage device according to the first embodiment. FIG. 5 shows eight memory cells MC being coupled between one of bit lines BL<0> and BL<1> and one of word lines WLa<0>, WLb<0>, WLa<1>, and WLb<1>.

As shown in FIG. 5, the row selection circuit 11 and the column selection circuit 12 execute control such that a voltage Vsel is applied between the selected word line WL and the selected bit line BL. The voltage Vsel is a voltage higher than a threshold voltage Vth of the selector SEL. The example in FIG. 5 shows a case, by way of example, where the voltage Vsel is applied to the selected word line WLa<0>, and a voltage VSS is applied to the selected bit line BL<1>. The voltage VSS is a ground voltage, and is, for example, 0V.

The voltage Vsel is applied to the selected memory cell MC. Thus, a voltage that is equal to or higher than the threshold voltage Vth is applied to the selector SEL in the selected memory cell MC. Thereby, the selector SEL in the selected memory cell MC is turned to the ON-state, making it possible to flow a write current or a read current through the magnetoresistive effect elements MTJ in the selected memory cell MC. When the direction of the current that is passed is to be reversed, the row selection circuit 11 and the column selection circuit 12 execute such control as to apply the voltage Vsel to the selected bit line BL<1>, and to apply the voltage VSS to the selected word line WLa<0>.

Figure 6:
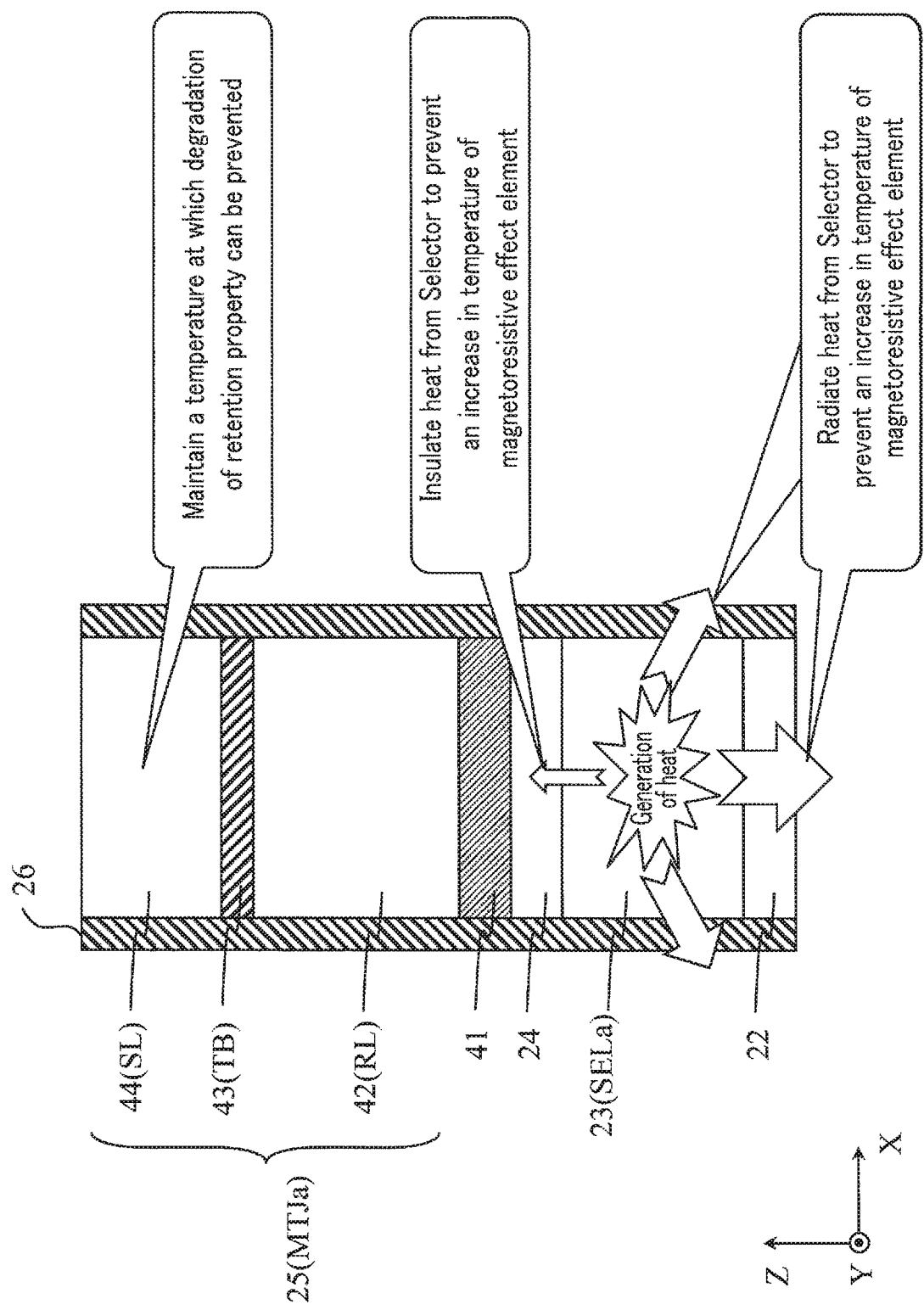
FIG. 6 is a schematic diagram for describing a heat radiation path in a memory cell of the magnetic storage device according to the first embodiment.

Also, the row selection circuit 11 and the column selection circuit 12 execute such control as to supply a voltage Vsel/2 to unselected word lines WL and unselected bit line BL. The voltage Vsel/2 is a voltage lower than the threshold voltage Vth at which the selector SEL is turned to the ON-state. The example in FIG. 6 shows, by way of example, a case where the voltage Vsel/2 is applied to word lines WLb<0>, WLa<1>, WLb<1>, and the bit line BL<0>. The memory cell MC disposed between the selected bit line BL and unselected word lines WL, and a memory cell MC disposed between the selected word line WL and unselected bit line BL are referred to as semi-selected memory cells (or memory cells in a semi-selected state). The voltage Vsel/2 is applied to the semi-selected memory cells MC. Thereby, a voltage lower than the threshold voltage Vth is applied to the selector SEL in the semi-selected memory cells MC. Thus, the selector SEL in each of the semi-selected memory cells MC is turned to the OFF-state, making it possible to prevent the write current or read current from flowing in the magnetoresistive effect elements within each of the semi-selected memory cells MC.

A memory cell MC disposed between a unselected bit line BL and a unselected word line WL is referred to as a unselected memory cell MC (or a memory cell in a unselected state). Since the voltage Vsel/2 is applied to both the unselected bit line BL and the unselected word lines WL, no voltage drop occurs in the unselected memory cell MC. Thereby, the selector SEL in each of the unselected memory cells MC is turned to the OFF-state, making it possible to present the write current or read current from flowing in the magnetoresistive effect elements MTJ in each of the unselected memory cells MC.

1.3 Advantageous Effects of the Present Embodiment

According to the first embodiment, it is possible to improve the retention property of the magnetoresistive effect elements. The advantageous effects will be described below.

FIG. 6 is a schematic diagram for describing a heat radiation path when a memory cell of the magnetic storage device according to the first embodiment generates heat. FIG. 6 shows a memory cell MCa by way of example of the memory cells MC, for simplification of the explanations. FIG. 6 schematically shows a heat radiation path when a selector SELa generates heat by the memory cell MCa's repetition of the selected state and the semi-selected state or the unselected state, for example, by write operations or read operations, etc.

As shown in FIG. 6, heat generated in an element 23 is radiated via materials around the element 23. Specifically, the thermal conductivity of the heat radiation material 22 disposed on a bottom surface of the element 23 is higher than the thermal conductivity of a heat insulation material 24 disposed on an upper surface of the element 23. For this reason, the heat radiation material 22 can radiate a larger amount of heat below the element 23 than the heat insulation material 24.

Similarly, the thermal conductivity of a heat radiation material 26 disposed on side surfaces of the element 23 is higher than the thermal conductivity of the heat insulation material 24. For this reason, the heat radiation material 26 can radiate a larger amount of heat in the direction of the side surfaces of the element 23 (X-direction) than the heat insulation material 24.

To supplement the explanations, if the magnetoresistive effect element MTJ is exposed to a high-temperature environment, data retained therein is highly likely to be lost. The retention property of the magnetoresistive effect element can be evaluated by a thermal stability factor Δ shown, for example, in the following equation (1).

$$\Delta = \Delta E/(k_B \times T) \tag{1}$$

Where kB denotes a Boltzmann's constant, T denotes a temperature, and ΔE denotes an energy barrier of a storage layer SL.

As shown in the equation (1), the thermal stability factor Δ is proportional to an ability of retaining data (energy barrier) of the storage layer SL and is inversely proportional to the temperature T, for example. In this way, it has been known that the higher the temperature T, the more the thermal stability factor Δ tends to degrade. More specifically, if the temperature T of the magnetoresistive effect element MTJ is, for example, increased to 85° C. or so, this may increase the possibility that a phenomenon, such as a reversal of retained data, and back hopping, etc., occurs. The back hopping is a phenomenon in which reversed data (e.g., data "1") is written relative to data to be written (e.g., data "0").

On the other hand, the selector SEL may generate heat in the order of several hundred degrees (° C.) by implementing write operations or read operations. For this reason, if heat released from the selector SEL is directly transmitted to the magnetoresistive effect elements MTJ, it is impossible for an interfacial heat resistance between the selector SEL and the magnetoresistive effect elements MTJ to sufficiently block the heat, and the temperature of the magnetoresistive effect elements MTJ may reach 85° C. or higher. Therefore, it is desired that heat radiated from the selector SEL be proactively radiated to the materials other than the magnetic resistance elect elements MTJ.

According to the first embodiment, the thermal conductivity of the heat radiation material 22 is set, for example, to 10 W/mK or higher, and the thermal conductivity of the heat radiation material 26 is set, for example, to a value greater than 5 W/mK. In contrast, the thermal conductivity of the heat insulation material 24 is set, for example, to 5 W/mK or lower. By setting the thermal conductivity in this way, it is possible to advantageously prevent heat from flowing into the ferromagnetic material 42, the nonmagnetic material 43, and the ferromagnetic material 44 via the heat insulation material 24, while releasing heat generated in the element 23 in directions of the side surfaces of the heat radiation material 22 and below the heat radiation material 22. For this reason, it is possible to prevent the temperature of the magnetoresistive effect elements MTJ from increasing to a temperature at which data stored in the magnetic resistance elements MTJ may be reversed, even in a case where the selector SEL generates heat in the order of several hundred degrees (° C.). Therefore, it is possible to prevent the retention property of the magnetoresistive effect elements MTJ from degrading.

In addition, the magnetoresistive effect elements MTJ may include a nonmagnetic material 41 functioning as a bottom electrode BE between the ferromagnetic material 42 and the element 23. Also in this case, since the heat insulation material 24 is disposed between the nonmagnetic material 41 and the element 23, it is possible to block an excessive heat in-flow to the magnetoresistive effect elements MTJ. Therefore, it is possible to prevent the retention property of the magnetoresistive effect elements MTJ from degrading.

2. Modification

In addition to the examples described above, the first embodiment described above allows various modifications.

In the memory cells MC described in the first embodiment, a case where the magnetoresistive effect element MTJ is disposed above the selector SEL is described; however, the embodiments of the present application are not limited thereto. For example, the memory cells MC may take a configuration where the selector SEL may be disposed above magnetoresistive effect elements MTJ. Hereinafter, mainly those points different from the first embodiment will be explained, and explanations on the same configurations as or similar configurations to those of the first embodiment will be omitted.

2.1 Configuration of Memory Cell Array

Figure 7:
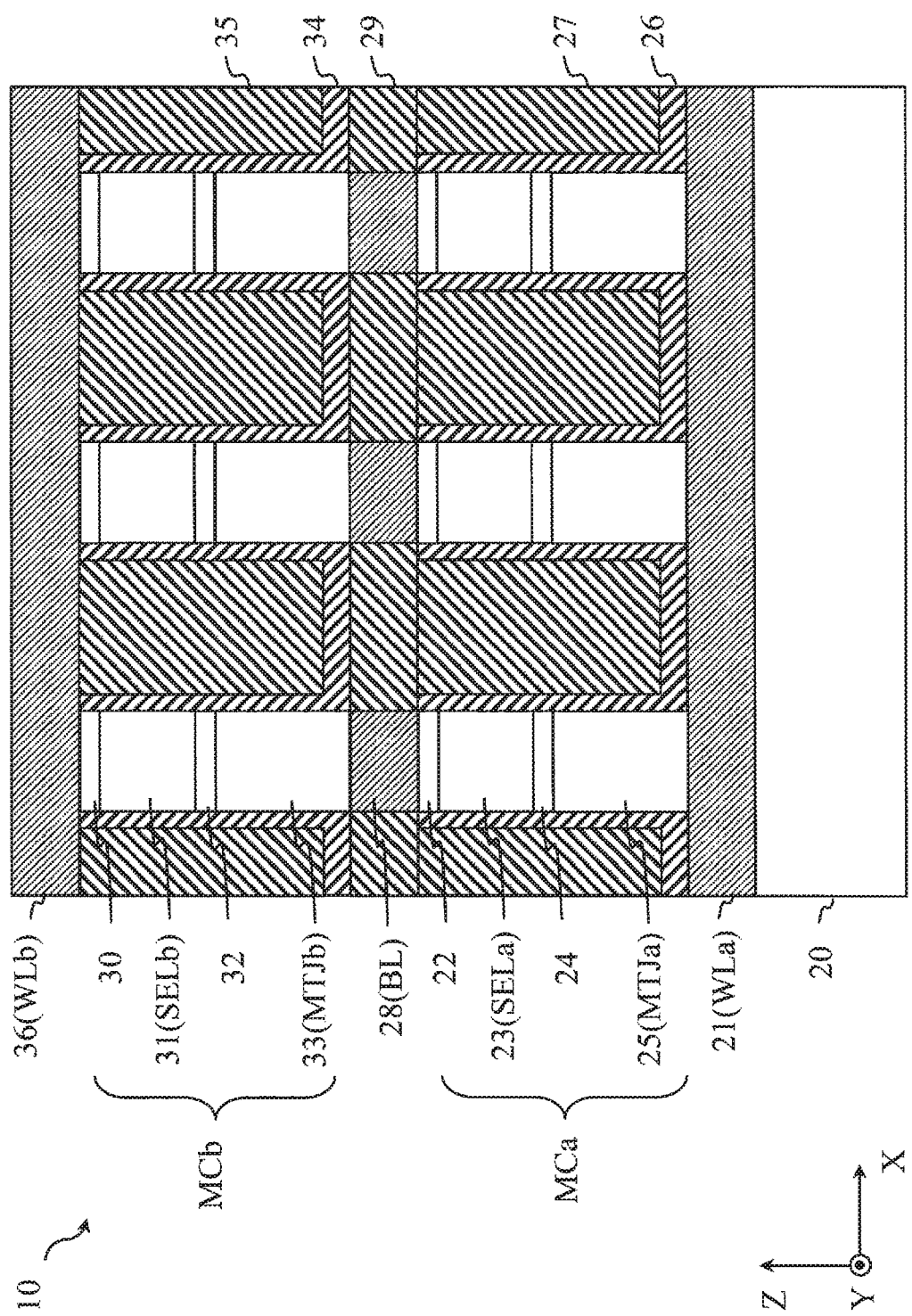
FIG. 7 is a cross-sectional view for describing the configuration of a memory cell array of a magnetic storage device according to a modification.

The cross-sectional configuration of a memory cell array 10 of a magnetic storage device 1 according to a modification will be described with reference to FIG. 7. FIG. 7 corresponds to FIG. 3 described in the first embodiment.

As shown in FIG. 7, on the upper portion of a semiconductor substrate 20, for example, a plurality of conductors 21 each functioning, for example, as a word line WLa are disposed. The plurality of conductors 21 are arranged, for example, along the Y-direction, and each of the conductors extends along the X-direction. On regions of the semiconductor substrate 20 where the conductor 21 is not disposed, an insulator (not shown) is disposed, for example, up to the height of the conductors 21.

On or above the conductor 21, an element 25 functioning as a magnetoresistive effect element MTJa is disposed. A plurality of elements 25 arranged along the X-direction are coupled in common to one conductor 21.

On respective upper portions of the plurality of elements 25, a heat insulation material 24 is disposed. The heat insulation material 24 has a function to prevent heat generated by the selector SELa from being transmitted to the lower layers (on the magnetoresistive effect elements MTJa side) while having a function as a conductor to become an electric current path of the memorial cell MCa.

On respective upper portions of the heat insulation material 24 disposed in a plurality of locations, an element 23 functioning as a selector SELa is disposed.

On respective upper portions of the plurality of elements 23, a heat radiation material 22 is disposed. The heat radiation material 22 has a function to radiate heat generated by the selector SELa toward the conductors 28 side, while having a function as a conductor to become an electric current path of the memory cell MCa.

On surfaces of the upper portions of the conductors 21 where the element 25 is not disposed, and on side surfaces of the element 25, the heat insulation material 24, the element 23, and the heat radiation material 22 stacked in this order along the Z-direction, a heat material 26, for example, is disposed. The heat radiation material 26 has a function to radiate heat generated by the selector SELa to an insulator 27 while insulating the memory cell MCa from the other memory cells MCa (and memory cells MCb). On the heat radiation material 26, for example, the insulator 27 is disposed, for example, up to the height of the heat radiation material 22.

On respective upper portions of the heat radiation material 22 disposed in a plurality of locations, a conductor 28 functioning as a bit line BL is disposed. A plurality of conductors 28 are arranged, for example, along the X-direction, and each of the conductors extends in the Y-direction. The plurality of conductors 28 respectively arranged along the X-direction are coupled in common with the heat radiation material 22 disposed in the plurality of locations so as to be arranged along the Y-direction. On surfaces of the top surfaces of the heat radiation material 26 and the insulator 27 where the conductor 28 is not disposed, for example, an insulator 29 is disposed, for example, up to the height of the conductor 28.

On respective upper portions of the plurality of conductors 28, a plurality of elements 33 functioning as magnetoresistive effect elements MTJb are disposed. The plurality of elements 33 arranged along the Y-direction are coupled in common to one conductor 28.

On respective upper portions of the plurality of elements 33, a heat insulation material 32 is disposed. The heat insulation material 32 has a function to prevent heat generated by the selector SELb from being transmitted to the lower layers (on the the magnetoresistive effect elements MTJb side) while having a function as a conductor to become an electric current path of the memory cell MCb.

On respective upper portions of the heat insulation material 32 disposed in a plurality of locations, an element 31 functioning as a selector SELb is disposed.

On the respective upper portions of the heat insulation material 32 disposed in the plurality of locations, a heat radiation material 30 is disposed. The heat radiation material 30 has a function to radiate heat generated by the selector SELb toward the conductor 36 side, while having a function as a conductor to become an electric current path of the memory cell MCb.

On surfaces of the upper portions of the conductors 28 where the element 33 is not disposed, on the upper portion of the insulator 29, and on side surfaces of the element 33, the heat insulation material 32, the element 31, and the heat radiation material 30 stacked in this order along the Z-direction, a heat radiation material 34, for example, is disposed. The heat radiation material 34 has a function to radiate heat generated by the selector SELb to an insulator 35, while insulating the memory cell MCb from the other memory cells MCb (and memory cells MCa). On the heat radiation material 34, the insulator 35 is disposed up to the height of the heat radiation material 30.

On respective upper portions of the heat radiation material 30 disposed in a plurality of locations, a conductor 36 that functions as a word line WLb is disposed. A plurality of conductors 36 are arranged, for example, along the Y-direction, and each of the conductors extends along the X-direction. The plurality of conductors 36 respectively arranged along the Y-direction are coupled in common to the heat radiation material 30 disposed in the plurality of locations so as to be arranged along the X-direction. On regions of the top surfaces of the insulator 34 and 35 where the conductor 36 is not disposed, an insulator (not shown) is disposed, for example, up to the height of the conductor 36.

By being configured as described above, the memory cell array 10 has a structure (stacked cross-point structure), in which cross-point type structures each capable of selecting one memory cell MC by a pair of one bit line BL and one word line WL are stacked in the Z-direction.

2.2 Configuration of Magnetoresistive Effect Element

Next, the configuration of a magnetoresistive effect element of the magnetic storage device according to the modification will be described with reference to FIG. 8. FIG. 8 is one example of a cross-sectional view where a magnetoresistive effect element in the magnetic storage device according to the modification is cut along an XZ-plane.

As shown in FIG. 8, elements 25 and 33 each include a ferromagnetic material 42 functioning as a reference layer RL, a nonmagnetic material 43 functioning as a tunnel barrier layer TB, and a ferromagnetic material 44 functioning as a storage layer SL. The ferromagnetic material 42, the nonmagnetic material 43, and the ferromagnetic material 44 constitute a magnetic tunnel junction. A nonmagnetic material 45 functioning as a top electrode TE is disposed on a top surface of the ferromagnetic material 44.

The nonmagnetic material 45 has nonmagnetism and includes, for example, tantalum (Ta), tungsten (W), titanium nitride (TiN), and tantalum nitride (TAN). The nonmagnetic material 45 functions as a conductor (electrode) that electrically couples the magnetoresistive effect element MTJ and the selector SEL. With this configuration, the nonmagnetic material 45 can have a thermal conductivity nearly equal to those of metals (e.g., 10 W/mK or higher, and more preferably, 20 W/mK or higher).

2.3 Advantageous Effects of Present Embodiment

According to the modification, it is possible to improve the retention property of the magnetoresistive effect elements, like the first embodiment.

Figure 9:
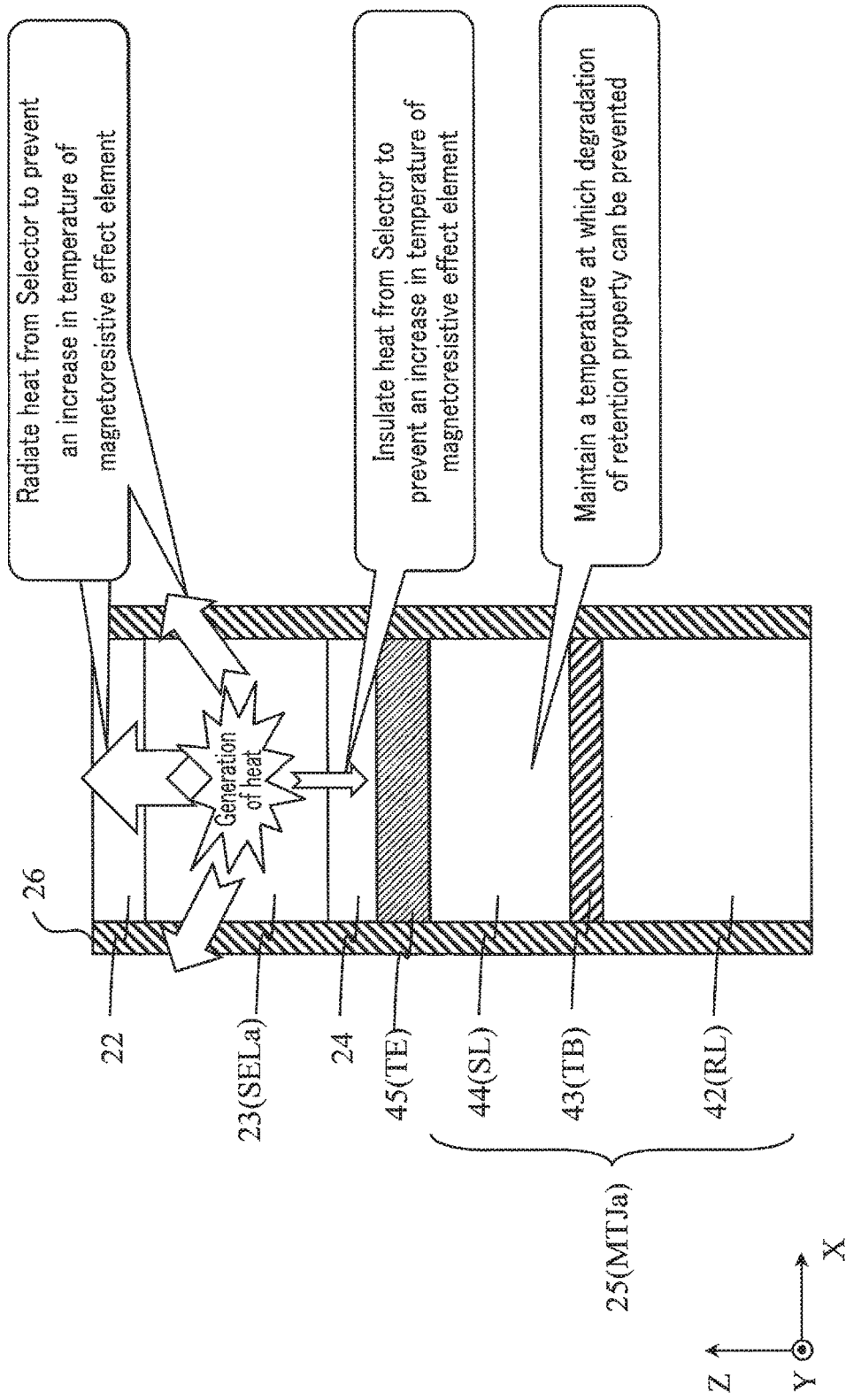
FIG. 9 is a schematic diagram for describing a heat radiation path in a memory cell in the magnetic storage device according to the modification.

FIG. 9 is a schematic diagram for describing a heat radiation path when a memory cell of the magnetic storage device according to the modification generates heat. As shown in FIG. 9, heat generated in the element 23 is radiated via the materials around the element 23. Specifically, the thermal conductivity of the heat radiation material 22 disposed on the top surface of the element 23 is higher than the thermal conductivity of a heat insulation material 24 disposed on the bottom surface of the element 23. For this reason, the heat radiation material 22 can release a larger amount of heat above the element 23 than the heat insulation material 24.

Similarly, the thermal conductivity of the heat radiation material 26 disposed on side surfaces of the element 23 is higher than the thermal conductivity of the heat insulation material 24. For this reason, the heat radiation material 26 can release a larger amount of heat in the side surfaces direction (X-direction) than the heat insulation material 24.

In this way, even in a case where the layer-stacking order of the selector SEL and the magnetoresistive effect element MTJ is reversed, it is possible to prevent the temperature of the magnetoresistive effect elements MTJ from increasing up to a temperature at which data stored in the magnetic resistance elements MTJ may be reversed. Therefore, it is possible to prevent the retention property of the magnetoresistive effect elements MTJ from degrading.

The magnetoresistive effect elements MTJ may include a nonmagnetic material 45 functioning as a top electrode TE between the ferromagnetic material 44 and the element 23. Also in this case, an excessive heat in-flow to the magnetoresistive effect element MTJ can be blocked, since the heat insulation material 24 is disposed between the nonmagnetic material 45 and the element 23. Therefore, it is possible to prevent the retention property of the magnetoresistive effect elements MTJ from degrading.

3. Others

Each of the embodiments and modifications describes a case where the magnetoresistive effect elements (MTJ) described therein are of a top free type in which a storage layer SL is disposed above a reference layer RL; however, the embodiments and modifications of the present application are not limited thereto. For example, the magnetoresistive effect elements (MTJ) may be of a bottom free type in which a storage layer SL is disposed below a reference RL. Furthermore, although the magnetoresistive effect element MTJ described in each of the above embodiments and modifications is a perpendicular magnetization MTJ, the magnetoresistive effect element MTJ may be a horizontal magnetization MTJ element which has a horizontal magnetic anisotropy While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic storage device comprising:
    a first memory cell including a magnetoresistive effect element, a selector, and a first barrier material disposed between the selector and the magnetoresistive effect element,
    wherein the first barrier material has a thermal conductivity between 1 W/mK and 5 W/mK, inclusive,
    wherein the first memory cell further includes a second barrier material disposed so that the selector is placed between the first barrier material and the second barrier material, and
    wherein the second barrier material has a thermal conductivity higher than the thermal conductivity of the first barrier material.

2. The device of claim 1, wherein the first barrier material includes carbon (C), carbon nitride (CN), or carbon boride (CB).

3. The device of claim 1, wherein the thermal conductivity of the second barrier material is 10 W/mK or higher.

4. The device of claim 1, wherein the second barrier material includes tungsten (W), tungsten nitride (WN), or titanium nitride (TiN).

5. The device of claim 1, wherein the selector, the first barrier material, and the magnetoresistive effect element are stacked above a semiconductor substrate,
    wherein the first memory cell further includes an insulator disposed on a side surface of the selector, and
    wherein the insulator has a thermal conductivity greater than the thermal conductivity of the first barrier material.

6. The device of claim 5, wherein the thermal conductivity of the insulator is higher than 5 W/mK.

7. The device of claim 5, wherein the insulator includes silicon nitride (SiN).

8. The device of claim 1, wherein the selector includes a two-terminal switching element.

9. The device of claim 8, wherein the selector includes a chalcogenide.

10. The device of claim 9, wherein the selector further includes at least one of tellurium (Te), boron (B), aluminum (Al), gallium (Ga), indium (In), carbon (C), silicon (Si), germanium (Ge), tin (Sn), arsenic (As), phosphorus (P), and antimony (Sb).

11. The device of claim 1, wherein the first memory cell further includes a first nonmagnetic material disposed between the first barrier material and the magnetoresistive effect element, and
wherein the first nonmagnetic material has a thermal conductivity of 10 W/mK or higher.

12. The device of claim 1, further comprising a second memory cell including the magnetoresistive effect element, the selector, and the first barrier material,
wherein the first memory cell is configured to be capable of electrically connecting a first conductor and a second conductor,
wherein the second memory cell is configured to be capable of electrically connecting the second conductor and a third conductor, and
wherein the second memory cell is disposed above the first memory cell.

13. The device of claim 12, further comprising a controller configured to control write of data to the first memory cell,
wherein the controller is configured to apply, at a time of the write of the data to the first memory cell, a first voltage to the first conductor, a second voltage different from the first voltage to the second conductor, and a third voltage between the first voltage and the second voltage to the third conductor.

14. The device of claim 13, wherein a difference between the first voltage and the second voltage is greater than a threshold voltage of the selector, and
wherein a difference between the second voltage and the third voltage is less than the threshold voltage of the selector.

15. The device of claim 1, wherein the magnetoresistive effect element includes a first ferromagnetic material, a second ferromagnetic material, and a second nonmagnetic material disposed between the first ferromagnetic material and the second ferromagnetic material.

16. The device of claim 15, wherein the magnetoresistive effect element is disposed below the selector.

17. The device of claim 15, wherein the magnetoresistive effect element is disposed above the selector.

* * * * *